United States Patent
Tsai et al.

(10) Patent No.: US 7,102,159 B2
(45) Date of Patent: Sep. 5, 2006

(54) ULTRA THIN IMAGE SENSOR PACKAGE STRUCTURE AND METHOD FOR FABRICATION

(75) Inventors: Chen Jung Tsai, Hsinchu (TW); Chih-Wen Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 8 days.

(21) Appl. No.: 10/865,983

(22) Filed: Jun. 12, 2004

(65) Prior Publication Data
US 2005/0275050 A1    Dec. 15, 2005

(51) Int. Cl.
*H01L 29/04* (2006.01)
(52) U.S. Cl. .......................... 257/53; 257/72; 257/84; 257/666
(58) Field of Classification Search ................. 257/53, 257/72, 84, 666
See application file for complete search history.

(56) References Cited

U.S. PATENT DOCUMENTS

| | | |
|---|---|---|
| 6,274,927 B1 | 8/2001 | Glenn |
| 6,384,472 B1 | 5/2002 | Huang |
| 6,526,653 B1 | 3/2003 | Glenn et al. |
| 6,643,919 B1 * | 11/2003 | Huang .......................... 29/827 |

* cited by examiner

*Primary Examiner*—Fetsum Abraham
(74) *Attorney, Agent, or Firm*—Stout, Uxa, Buyan & Mullins, LLP

(57) ABSTRACT

An image sensor package having at least one chip supporting bar secured to a top surface of an image sensor chip. The thickness of the chip supporting bar is absorbed within a vertical dimension of wire loops that connect bonding pads to leads so that the chip supporting bar does not contribute to the thickness of the image sensor package. An exposed back surface of the image sensor chip enhances thermal dissipation.

13 Claims, 7 Drawing Sheets

ULTRA THIN IMAGE SENSOR PACKAGE STRUCTURE AND METHOD FOR FABRICATION

BACKGROUND OF THE INVENTION

1. Field of the Invention

The present invention relates generally to semiconductor fabrication methods and, more particularly, to fabrication of an ultra thin image sensor package structure.

2. Description of Related Art

Personal devices that employ image sensors are rapidly proliferating. Personal data assistants (PDAs) and cell phones now join digital cameras and camcorders in the family of products that frequently include image sensing capabilities. Because of their small size and the requirement for portability, such products benefit greatly from the existence of miniature electronics. Any opportunity to reduce the size, weight, and power consumption of image sensing electronic components accrues to the benefit of these personal devices and, therefore, to the public in general in terms of convenience and utility.

FIG. 1 is a cross-sectional diagram of a prior-art image sensor package 10 that may appear in a device such as a digital camera. This package comprises an image sensor chip 15 that is supported by a leadframe 20. Leads 25 on the leadframe 20 are connected to a plurality of bonding pads 30 on the image sensor chip 15 by a plurality of wire loops 35. A transparent lid 40 disposed on a surface of the image sensor package 10 allows light to reach an active light-sensitive surface on the image sensor chip 15. The entire assembly is encapsulated in a plastic package 45 that protects the internal components from dust, moisture, and mechanical damage.

Each of the components just introduced contributes to the thickness and weight of the image sensor package 10. In particular, a bottom portion 50 of the plastic package 45, the leadframe 20 that supports the image sensor chip 15, the image sensor chip 15 itself, the height of the wire loops 35, and the thickness of the transparent lid 40 all contribute to a total thickness of the device. Each of these components has a weight as well that contributes to the total weight of the device. Further, the bottom portion 50 of the plastic package 45 may act as a thermal insulator that undesirably tends to impede the dissipation of heat generated by the image sensor chip 15.

FIG. 2 is a cross-sectional diagram of another prior art image sensor package 60 packaged in, for example, a quad flat pack (QFP). This exemplary device also comprises an image sensor chip 65 that is supported by a leadframe 70. As before, leads 75 on the leadframe 70 are connected to bonding pads 80 on the image sensor chip 65 by wire loops 85. A transparent lid 90 disposed on a surface of the package allows light to reach an active light-sensitive surface on the image sensor chip 65. The entire assembly is encapsulated in a plastic package 95 that protects the internal components from dust, moisture, and mechanical damage. It should be noted that the leadframe 70, for example, contributes to the thickness and weight of the image sensor package 60.

As the capabilities of image sensing products continue to expand, while the demand for smaller and more lightweight products expands, a need continues in the prior art for image sensor packages that are relatively thin and lightweight compared to existing packages. A further need exists for packages that can efficiently dissipate heat generated by image sensor chips.

SUMMARY OF THE INVENTION

The present invention addresses these needs by providing an image sensor package with a support for an image sensor chip disposed on a top active surface of the image sensor chip. In certain embodiments, elimination of a portion of the leadframe can contribute to a reduction in thickness and weight of the image sensor package. A back surface of the image sensor chip can be exposed, thereby enhancing thermal dissipation.

One embodiment of the present invention takes the form of an image sensor package comprising an image sensor chip having an active surface and a corresponding back surface. The active surface can comprise a light receiving area and a peripheral area having a plurality of bonding pads. The image sensor package further may comprise a leadframe having a plurality of leads disposed at a periphery of the image sensor chip, the leads having bonding and non-bonding surfaces. The leadframe further may comprise at least one elongated chip supporting bar that is attached to the peripheral area of the image sensor chip in a manner that does not interfere with the plurality of bonding pads. A plurality of wires further may be disposed to electrically connect the bonding pads to the bonding surfaces of the leads. An encapsulation may cover at least a portion of the image sensor chip, the bonding surfaces of the plurality of leads, and a portion of the at least one elongated chip supporting bar. Typically, the encapsulation forms a cavity over the active surface, exposing the light receiving area. A transparent lid normally can be disposed over the cavity to direct light to the light receiving area.

The present invention further comprises a method of fabricating an image sensor package. An embodiment of the method can comprise providing a leadframe having a plurality of leads, each lead having a bonding surface and a non-bonding surface. Portions of the leadframe may be encapsulated to form a chip support cavity having an inner surface. The bonding surfaces of the leads can remain exposed after the encapsulation. An image sensor chip is further provided, the image sensor chip having an active surface that includes a light receiving area and a peripheral area having a plurality of bonding pads. The image sensor chip may comprise a back surface corresponding to or opposite to the active surface, the back surface attaching to the inner surface of the chip support cavity. Wires may be connected between the bonding pads and the bonding surfaces of the leads, and a transparent lid may be formed. The transparent lid can be disposed to direct light to the light receiving area.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
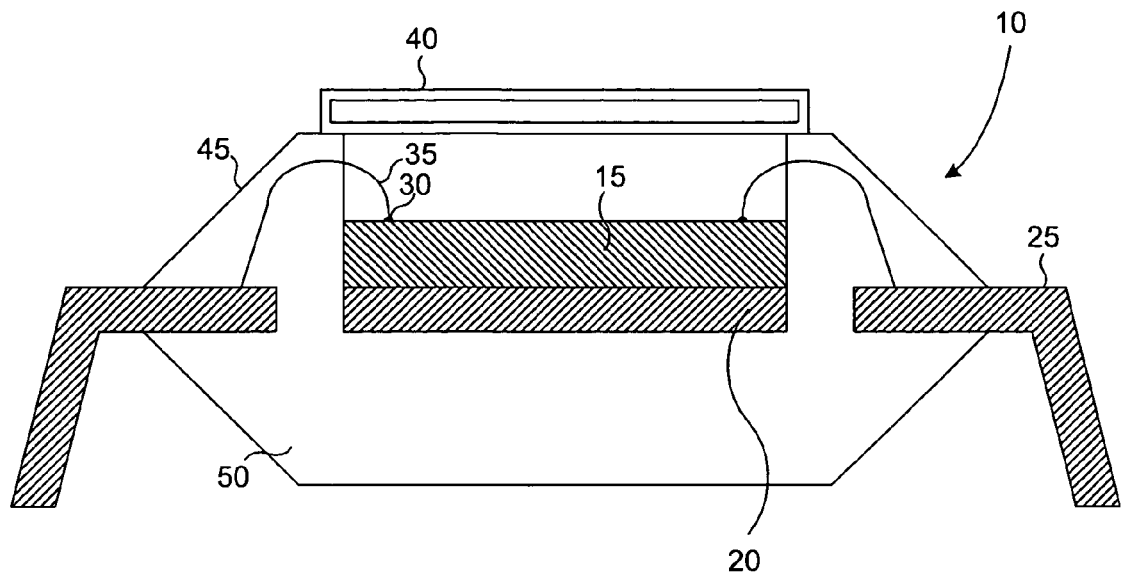
FIG. 1 is a cross-sectional view of a prior-art image sensor package.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of image sensor packages. The present invention may be practiced in conjunction with various integrated circuit fabrication techniques that are conventionally used in the art, and only so much of the commonly practiced structure and process steps are included herein as are necessary to provide an understanding of the present invention.

Figure 3A:
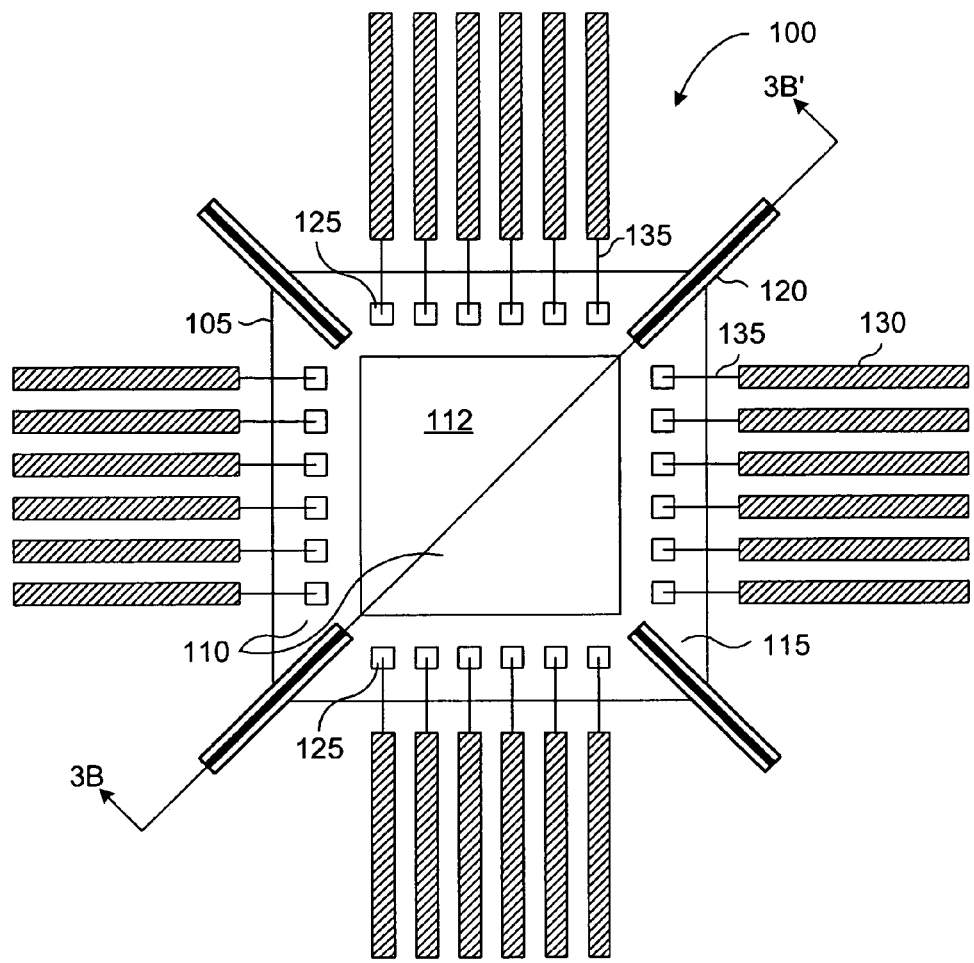
FIG. 3A is a plan view of an embodiment of an image sensor package fabricated according to the present invention.

Referring more particularly to FIG. 3A, a plan view of a portion of an embodiment of an image sensor package 100, fabricated according to the present invention, is shown. The illustrated embodiment portion comprises an image sensor chip 105 having an active surface 110. The active surface 110 comprises a light receiving area 112 capable of receiving light and a peripheral area 115 that may surround the light receiving area 112. A plurality of bonding pads 125 is disposed on the peripheral area 115 of the image sensor chip 105. A leadframe comprising a plurality of leads 130 surrounds the image sensor chip 105. A plurality of conductive wires 135 connects the plurality of bonding pads 125 to the plurality of leads 130. According to a typical embodiment of the image sensor package 100, each of the plurality of leads 130 has a bonding surface and a non-bonding surface as is more particularly described in that which follows.

Figure 3B:
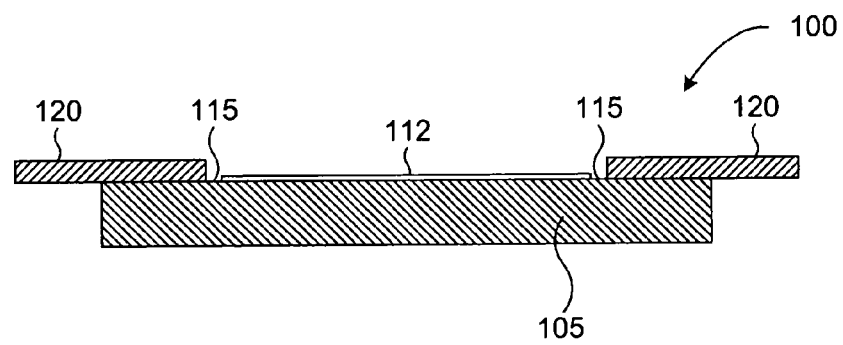
FIG. 3B is a cross-sectional view of the embodiment of the image sensor package illustrated in FIG. 3A.

In accordance with an aspect of the present invention, the leadframe comprises at least one elongated chip supporting bar 120 which may be secured to the peripheral area 115 of the image sensor chip 105. The chip supporting bar 120 normally is placed so as to extend outwardly from an edge of the active surface 110 and further is placed so as not to interfere with the bonding pads 125 or the light receiving area 112. The chip supporting bar 120 may be secured to the image sensor chip 105 by, for example, a solid (e.g., film) or liquid (e.g., epoxy) non-conducting adhesive. The illustrated embodiment portion comprises four chip supporting bars 120 attached to the peripheral area 115 of the image sensor chip 105. In modified embodiments, greater or fewer chip supporting bars 120 may be implemented. A cross-sectional view of the portion of image sensor package 100 is illustrated in FIG. 3B, the cross-section being taken along the line 3B–3B' of FIG. 3A.

Figure 4:
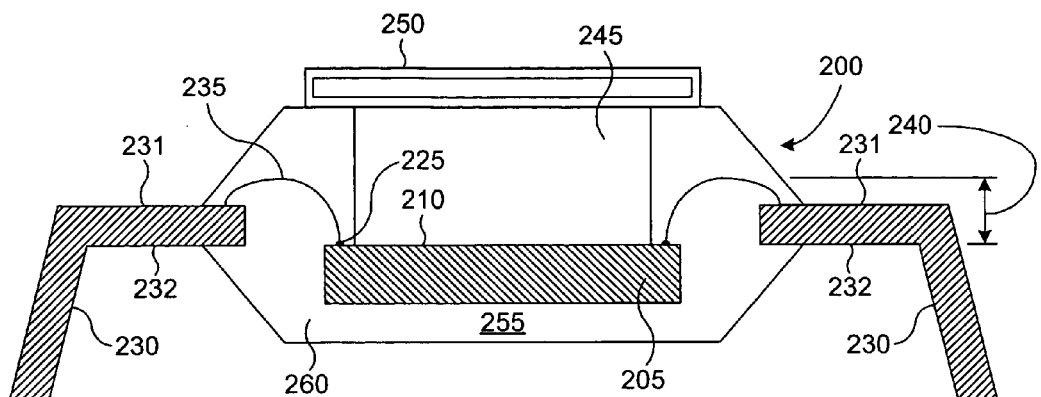
FIGS. 4–6 are cross-sectional views of exemplary embodiments of image sensor packages fabricated in accordance with the present invention.
Figure 5:
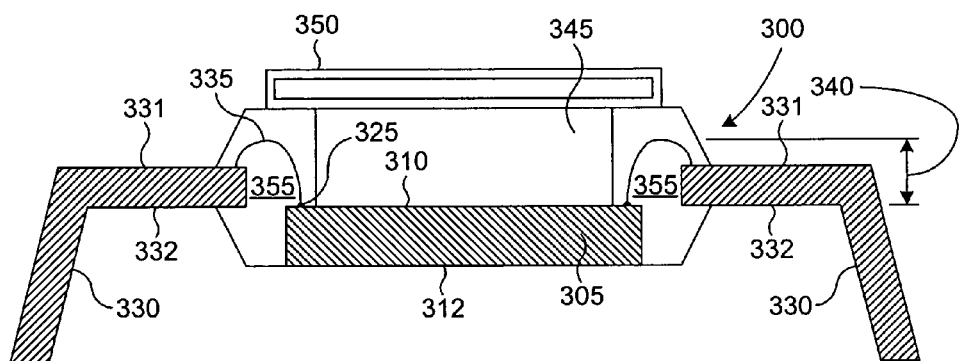
Figure 6:
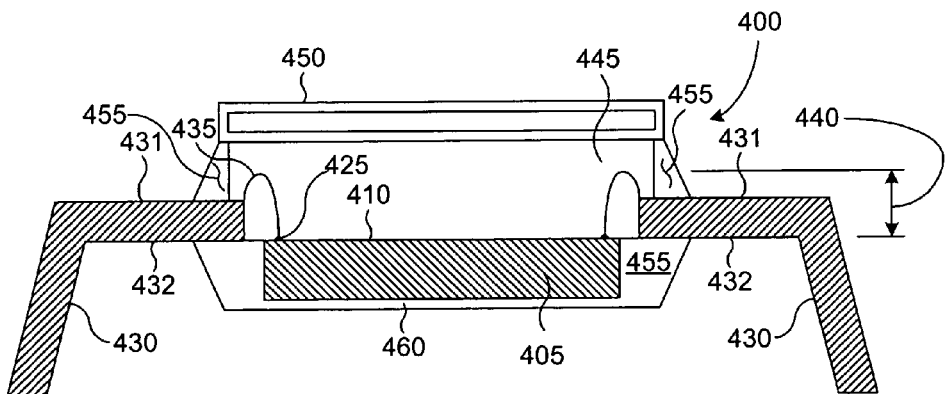

FIGS. 4–6 are cross-sectional views of exemplary embodiments of image sensor packages fabricated according to various aspects of the present invention. FIG. 4 is a cross-sectional view of an embodiment of an image sensor package 200 comprising an image sensor chip 205 having an active surface 210. A plurality of bonding pads 225 are disposed on a periphery of the active surface 210. A leadframe comprising a plurality of leads 230 having bonding surfaces 231 and non-bonding surfaces 232 surrounds the image sensor chip 205. A plurality of conductive wires 235 connects the bonding pads 225 to the bonding surfaces 231 of the leads 230. At least one elongated chip supporting bar (cf. FIGS. 3A and 3B), secured to a top surface of the image sensor chip 205, supports the image sensor chip 205.

The embodiment illustrated in FIG. 4 further comprises a cavity 245 and a transparent lid 250 disposed on a top of the image sensor package 200. The transparent lid 250, which may have one or more of a concave, convex, or flat shape, is capable of receiving light and of directing the light through the cavity 245 to the active surface 210 of the image sensor chip 205. The embodiment further comprises a plastic package 255 that encapsulates parts of the image sensor chip 205, the leadframe, the wires 235, and the leads 230, while protecting the image sensor chip 205 from dust, moisture, and mechanical damage. In the illustrated embodiment, plastic is chosen as an insulating material to cover the wires 235. A bottom portion 260 of the plastic package 255 underlies the image sensor chip 205.

As a result of the chip supporting bar being secured to the active surface 210 of the image sensor chip 205, the image sensor chip 205 is supported, so that, for example, the leadframe does not need to underlie and support the image sensor chip 205. The height of the chip supporting bar may be less than the height 240 of loops formed by the wires 235.

Therefore, in accordance with an aspect of the present invention, the height of the chip supporting bar does not contribute to the total height of the image sensor package 200. In order to further reduce the total package thickness, the height 240 of loops formed by the wires 235 can be constructed to be less than the total thickness of the chip supporting bar 120 and the non-conducting adhesive. Moreover, the image sensor chip 205 does not need to be supported above the leadframe and thus can be disposed at a lower height within the image sensor package 200. In contrast, the leadframes 20 (FIG. 1) and 70 (FIG. 2) underlie the image sensor chip and undesirably contribute to the total heights of the respective image sensor packages 10 and 60.

FIG. 5 is a cross-sectional view of an alternative embodiment of an image sensor package 300 comprising an image sensor chip 305 having an active surface 310 and a corresponding back surface 312. A plurality of bonding pads 325 is disposed about a periphery of the active surface 310. A leadframe comprising a plurality of leads 330 having bonding surfaces 331 and non-bonding surfaces 332 surrounds the image sensor chip 305. A plurality of conductive wires 335 connects the bonding pads 325 to the bonding surfaces 331 of the leads 330. At least one elongated chip supporting bar (cf. FIGS. 3A and 3B) is secured to a top surface of the image sensor chip 305 for supporting the image sensor chip 305. The embodiment illustrated in FIG. 5 further comprises a cavity 345 and a transparent lid 350 disposed on a top of the image sensor package 300. The transparent lid 350, which may be concave, convex, or flat, is capable of receiving light and of directing the light through the cavity 345 to the active surface 310 of the image sensor chip 305. The embodiment further comprises a plastic package 355 that encapsulates parts of the image sensor chip 305, the leadframe, the wires 335, and the leads 330 while protecting the image sensor chip 305 from dust, moisture, and mechanical damage.

The height of the chip supporting bar, which in the illustrated embodiment is secured to the active surface 310 of the image sensor chip 305, may be less than the height 340 of loops formed by the wires 335. In order to further reduce the total package thickness, the height 340 of loops formed by the wires 335 can be constructed to be less than the total thickness of the chip supporting bar and the non-conducting adhesive securing the chip supporting bar to the image sensor chip 305. As a result of the image sensor chip 305 not being supported above the leadframe, a relative position of the image sensor chip 305 can be lowered within the image sensor package 300, whereby for example a height of the chip supporting bar does not contribute to the total height of the image sensor package 300. The plastic package 355 in the illustrated embodiment does not comprise a bottom portion. Therefore, the back surface 312 of the image sensor chip 305 may be exposed to an external environment, thereby enhancing the dissipation of heat generated by the image sensor chip 305. The absence of a bottom portion can reduce the height of the image sensor package 300 when compared with the prior art image sensor package illustrated in FIG. 1 in which the bottom portion 50 contributes to the height of the image sensor package 10.

FIG. 6 is a cross-sectional view of an embodiment of another image sensor package 400 comprising an image sensor chip 405 having an active surface 410. At least one elongated chip supporting bar (cf. FIGS. 3A and 3B) is secured to a top surface of the image sensor chip 405 and supports the image sensor chip 405. The embodiment illustrated in FIG. 6 further comprises a cavity 445 and a transparent lid 450, which may comprise at least one of a concave, convex, or flat shape, disposed on a top of the image sensor package 400. The transparent lid 450 is capable of receiving light and of directing the light through the cavity 445 to the active surface 410 of the image sensor chip 405. A plurality of bonding pads 425 is disposed on a periphery of the active surface 410 within the cavity 445. A leadframe comprising a plurality of leads 430 having bonding surfaces 431 and non-bonding surfaces 432 surrounds the image sensor chip 405. A plurality of conductive wires 435 connects the bonding pads 425 to the bonding surfaces 431 of the leads 430. The embodiment further comprises a package 455 that encapsulates parts of the image sensor chip 405, the leadframe, and the leads 430 while protecting the image sensor chip 405 from dust, moisture, and mechanical damage. As a result of the package 455 not covering the bonding pads 425, bonding surfaces 431 and wires 435, the package 455 may be formed of a plastic resin as with previous embodiments or may comprise other materials such as ceramic.

As with the embodiments of FIGS. 4 and 5, a height of the chip supporting bar may be less than the height 440 of loops formed by the wires 435 as a result of the lower position of the image sensor chip 405. Therefore, the height of the chip supporting bar does not contribute to the total height of the image sensor package 400. In order to further reduce the total package thickness, the height 440 of loops formed by the wires 435 can be constructed to be less than the total thickness of the chip supporting bar and the non-conducting adhesive that secures the chip supporting bar to the image sensor chip 405.

Figure 2:
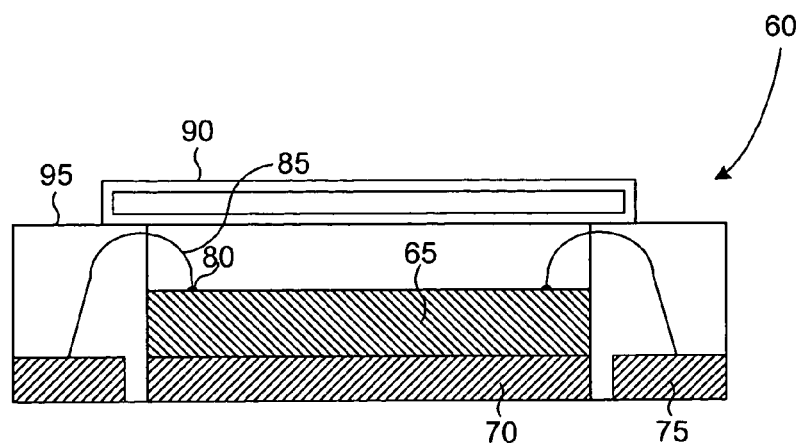
FIG. 2 is a cross-sectional view of another prior-art image sensor package.
Figure 7:
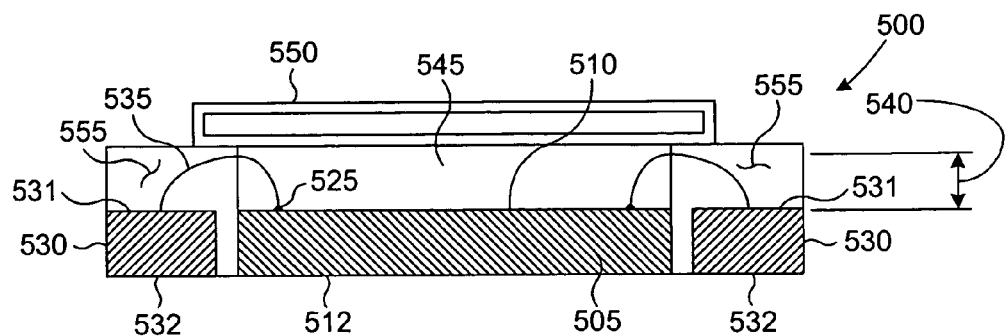
FIGS. 7–9 are cross-sectional views of additional embodiments of image sensor packages fabricated according to the present invention.
Figure 8:
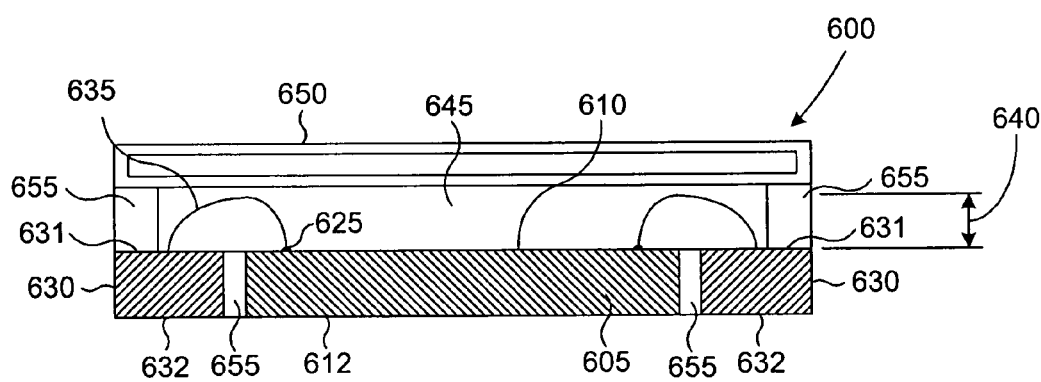
Figure 9:
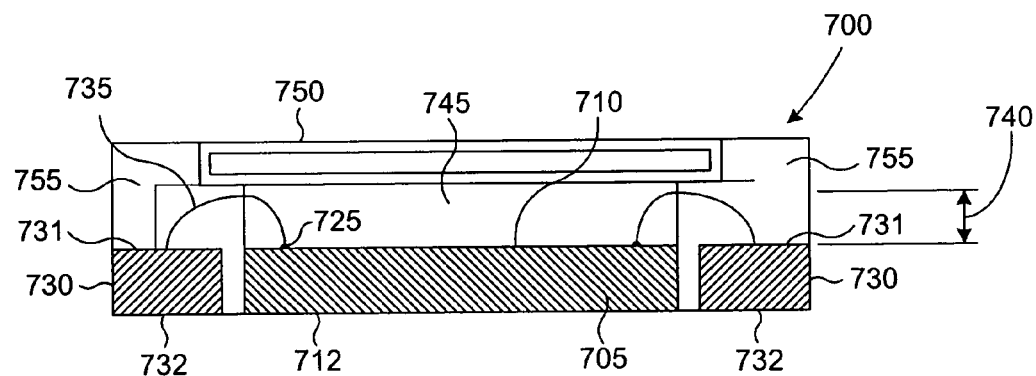

The package 455 in the illustrated embodiment comprises a bottom portion 460 that may be thinner than the bottom portion 50 of the prior art image sensor package 10 of FIG. 1. This thinner bottom portion 460 contributes less to the height of the image sensor package 400 when compared with the contribution of the bottom portion 50 to the height of the prior art image sensor package 10. In a modified embodiment, the bottom portion 460 may be omitted to expose a surface of the image sensor chip 405. FIGS. 7–9 are cross-sectional views of additional embodiments of image sensor packages fabricated according to various aspects of the present invention. Generally, these figures correspond to earlier-discussed embodiments with differences including (i) the non-bonding surfaces of leads being exposed to function as terminals (rather than outer leads) for electrical connection with a substrate such as a printed circuit board, and (ii) the chip back surfaces being exposed to enhance thermal dispersion. Compared with the prior art (e.g., FIG. 2) the total package thickness can be reduced by eliminating the chip supporting pad 70 (FIG. 2). FIG. 7 may be likened to FIG. 5, FIG. 8 may be likened to FIG. 6 but with the back surface exposed, and FIG. 9 may be likened to FIG. 7 but with a different encapsulation cavity shape.

FIG. 7 is a cross-sectional view of an embodiment of an image sensor package 500 comprising an image sensor chip 505 having an active surface 510 and a corresponding back surface 512. At least one elongated chip supporting bar (cf. FIGS. 3A and 3B) coupled to a top surface of the image sensor chip 505 supports the image sensor chip 505. The embodiment illustrated in FIG. 7 further comprises a cavity 545 and a transparent lid 550 disposed on a top of the image sensor package 500. The transparent lid 550, which may have one or more of a concave, convex, or flat shape, is capable of receiving light and of directing the light through the cavity 545 to the active surface 510 of the image sensor chip 505. A plurality of bonding pads 525 is disposed on the periphery of the active surface 510 within the cavity 545. A leadframe comprising a plurality of leads 530 having bonding surfaces 531 and non-bonding surfaces 532 may surround the image sensor chip 505. A plurality of conductive wires 535 connects the bonding pads 525 to the bonding surfaces 531 of the leads 530. The embodiment further comprises a plastic package 555 that encapsulates, for example, parts of the wires 535 and the leads 530, while protecting the image sensor chip 505 from dust, moisture, and mechanical damage. The height of the chip supporting bar may be less than the height 540 of loops formed by the wires 535. Therefore, the height of the chip supporting bar does not contribute to the total height of the image sensor package 500. In order to reduce the total package thickness, the height 540 of loops formed by the wires 535 can be constructed to be less than the total thickness of the chip supporting bar and the non-conducting adhesive securing the chip supporting bar to the image sensor chip 505. The plastic package 555 in the illustrated embodiment does not comprise a bottom portion. Therefore, the back surface 512 of the image sensor chip 505 may be exposed to an external environment, thereby enhancing the dissipation of heat generated by the image sensor chip 505.

FIG. 8 is a cross-sectional view of an embodiment of another image sensor package 600 comprising an image sensor chip 605 having an active surface 610 and a corresponding back surface 612. At least one elongated chip supporting bar (cf. FIGS. 3A and 3B), which is secured to a top surface of the image sensor chip 605, supports the image sensor chip 605. The embodiment illustrated in FIG. 8 further comprises a cavity 645 and a transparent lid 650 disposed on a top of the image sensor package 600. The transparent lid 650 is capable of receiving light and of directing the light through the cavity 645 to the active surface 610 of the image sensor chip 605. A plurality of bonding pads 625 is disposed on the periphery of the active surface 610 within the cavity 645. A leadframe comprising a plurality of leads 630 having bonding surfaces 631 and non-bonding surfaces 632 may surround the image sensor chip 605. A plurality of conductive wires 635 connects the bonding pads 625 to the bonding surfaces 631 of the leads 630. The embodiment further comprises a package 655 surrounding and/or encapsulating, for example, a portion of the image sensor chip 605 and the bonding surfaces 631 of the leads 630 while protecting the image sensor chip 605 from dust, moisture, and mechanical damage. As a result of the package 655 not covering the bonding pads 625, bonding surfaces 631 and wires 635, the package 655 may be formed of a plastic resin or may comprise other materials such as ceramic. The height of the chip supporting bar may be less than the height 640 of loops formed by the wires 635. Therefore, the height of the chip supporting bar does not contribute to the total height of the image sensor package 600. As mentioned above, the height 640 of loops formed by the wires 635 can be constructed to be less than the total thickness of the chip supporting bar and the non-conducting adhesive securing the chip supporting bar to the image sensor chip 405, to thereby reduce the total package thickness.

The plastic package 655 in the illustrated embodiment does not comprise a bottom portion. Therefore, the back surface 612 of the image sensor chip 605 may be exposed to an external environment, thereby enhancing the dissipation of heat generated by the image sensor chip 605.

FIG. 9 is a cross-sectional view of a modified image sensor package 700 having a structure similar to that of FIG. 7 except for the plastic package encompassing more of the transparent lid. In particular, the sensor package 700 comprises an image sensor chip 705 having an active surface 710 and a corresponding back surface 712. At least one elongated chip supporting bar (cf. FIGS. 3A and 3B), secured to a top surface of the image sensor chip 705, supports the image sensor chip 705. The embodiment illustrated in FIG. 9 further comprises a cavity 745 and a transparent lid 750 disposed on a top of the image sensor package 700. The transparent lid 750 is capable of receiving light and of directing the light through the cavity 745 to the active surface 710 of the image sensor chip 705. A plurality of bonding pads 725 is disposed on the periphery of the active surface 710 within the cavity 745. A leadframe comprising a plurality of leads 730 having bonding surfaces 731 and non-bonding surfaces 732 may surround the image sensor chip 705. A plurality of conductive wires 735 connects the bonding pads 725 to the bonding surfaces of the leads 730. The embodiment further comprises a plastic package 755 that encapsulates, for example, portions of the image sensor chip 705, wires 735, leads 730, and transparent lid 750, while protecting the image sensor chip 705 from dust, moisture, and mechanical damage. The height 740 of loops formed by wires 735 may be constructed to be less than the total thickness of the chip supporting bar and the non-conducting adhesive securing the chip supporting bar to the image sensor chip 605, for a reduced total package thickness.

In one or more of the embodiments illustrated in FIGS. 4–9, parts of the leadframe, wires and image sensor chip may be encapsulated by molding resin configured to allow the active surface of the image sensor chip to receive light.

Figure 10:
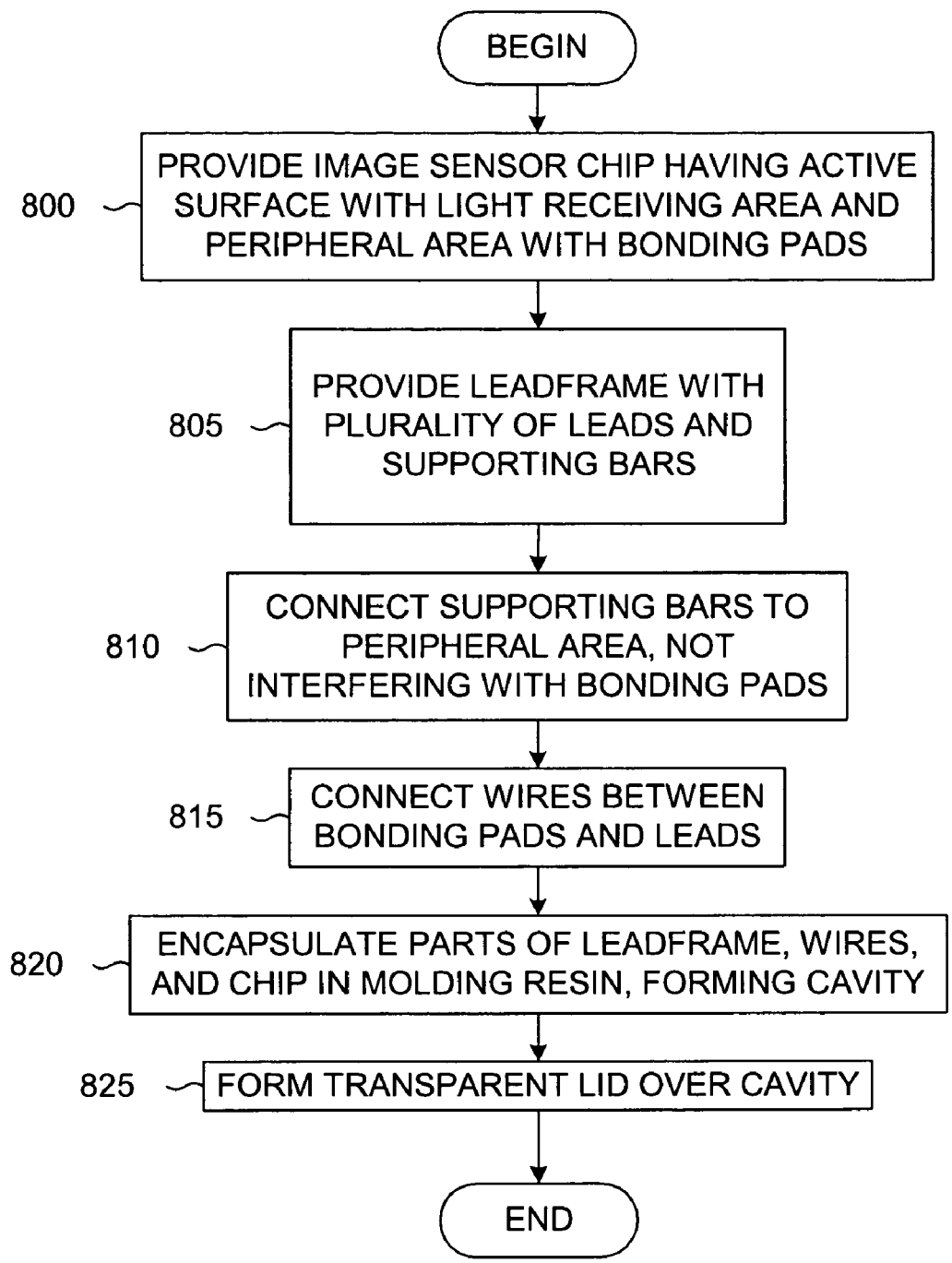
FIG. 10 is a flow diagram describing an illustrative method of fabricating an image sensor package in accordance with the present invention.

FIG. 10 is a flow diagram that describes an illustrative method of fabricating an image sensor package according to an implementation of the present invention. The method is described with reference to FIGS. 3A and 4, although the method could apply as well to the embodiments of, for example, FIGS. 5–9. Referring to FIG. 3A, an image sensor chip 105 is provided at step 800. The image sensor chip 105 typically comprises an active surface 110 that, according to an exemplary embodiment, comprises a light receiving area 112 and a peripheral area 115 having a plurality of bonding pads 125. A leadframe, including a plurality of leads 130 and at least one elongated chip supporting bar 120, is provided at step 805, which step, as with the other steps, may occur in a different order from that discussed and shown. For example, step 805 may occur commensurate in time with or separate from step 800. Also, with reference to, for example, the embodiments of FIGS. 6 and 8, since the encapsulating does not cover the wires, step 815 may be performed before or after step 820. Of course, when step 820 is implemented to construct the structures of FIG. 6 or 8, the wires may not be encapsulated at all. The at least one elongated chip supporting bar 120 is connected to the peripheral area 115 at step 810 in a manner that does not interfere with the plurality of bonding pads 125. Wires 135 are connected between the bonding pads 125 and the leads 130 at step 815. The leadframe, wires 135 (optionally), and image sensor chip 105 are at least partially surrounded and/or encapsulated in molding resin at step 820. The embodiment depicted in FIG. 4 illustrates an example of a cavity 245 that, according to an implementation of the present invention, may be formed by the encapsulation. A transparent lid 250 (FIG. 4) is formed at step 825 to direct light to and to seal the light receiving area 112 (FIG. 3A).

Figure 11:
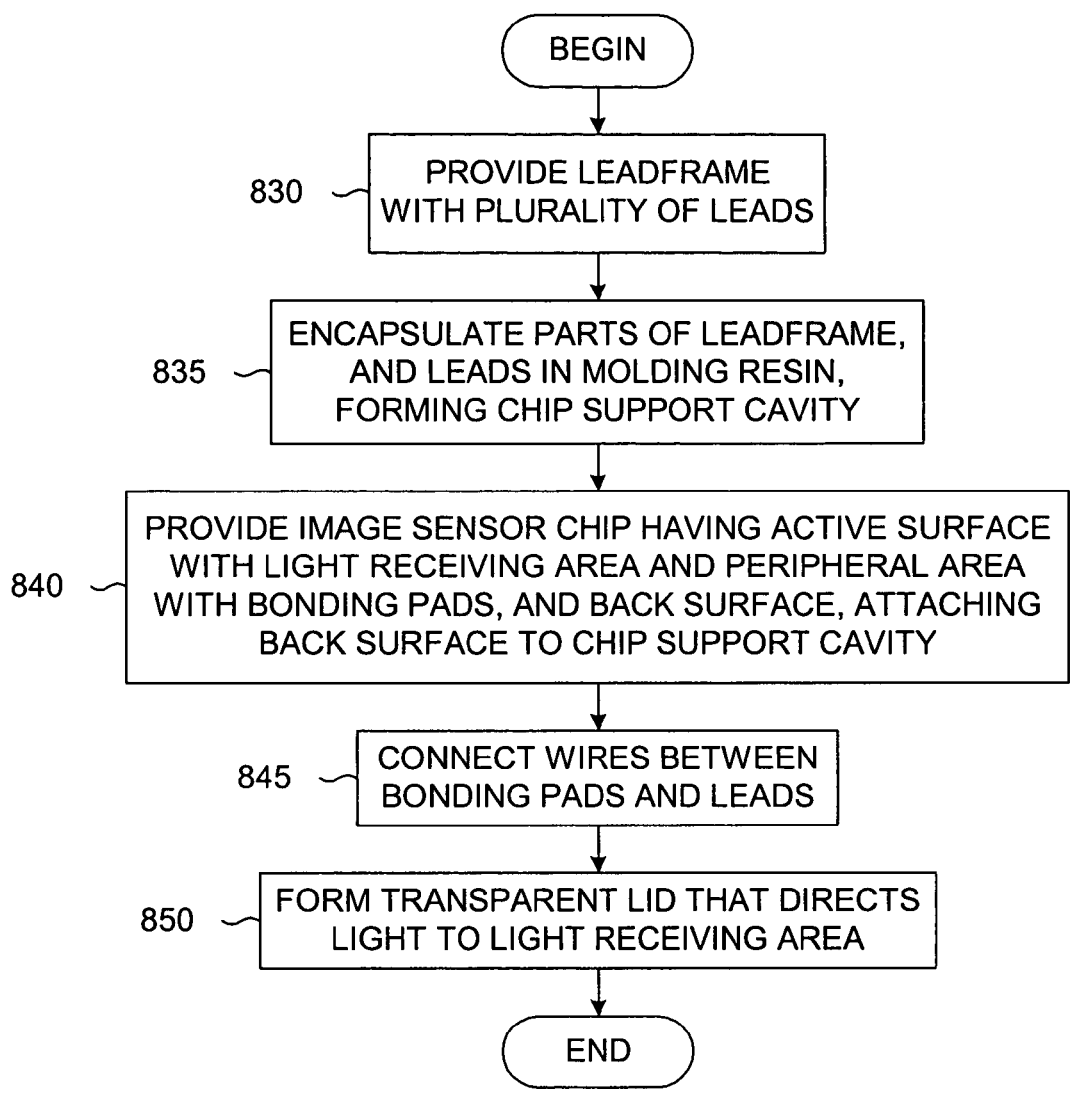
FIG. 11 is a flow diagram describing another example of a method of fabricating an image sensor package according to the present invention.
Figure 12A:
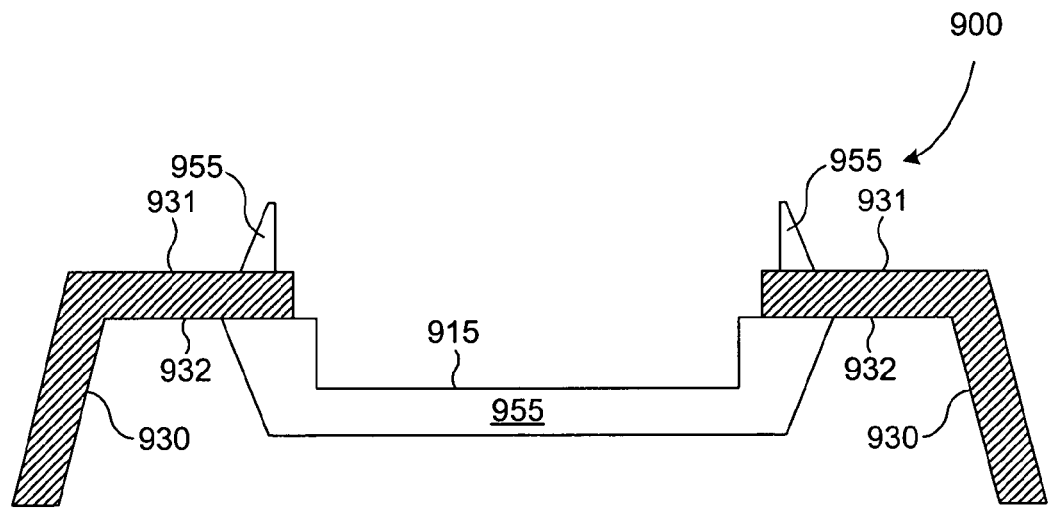
FIGS. 12A and 12B are cross-sectional views of an image sensor package that illustrates steps of the method described in FIG. 11.
Figure 12B:
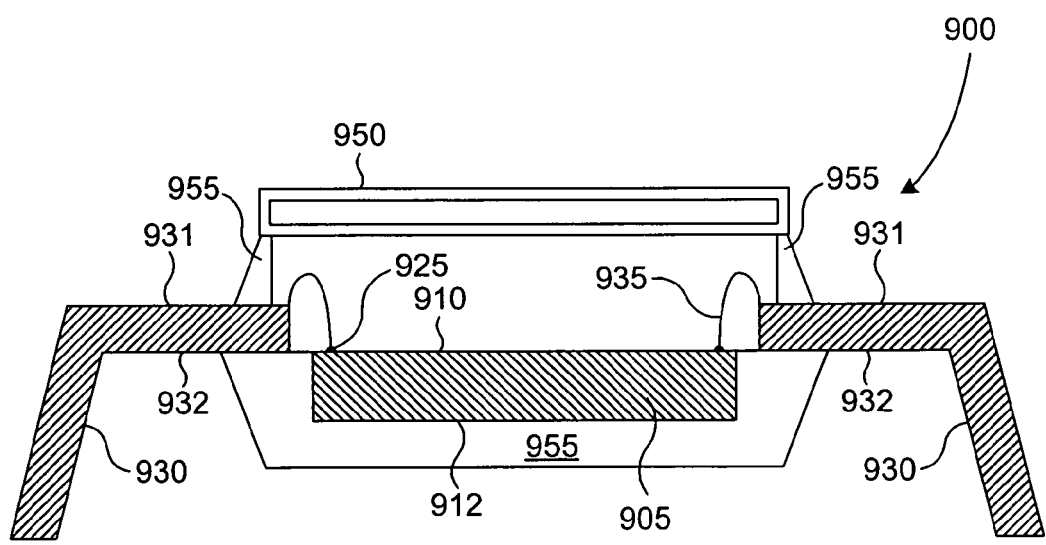

In an alternative embodiment of the invention, an image sensor package is fabricated without chip supporting bars as described in FIG. 11 with reference to FIGS. 12A and 12B. The constructions and steps of this embodiment may be combined with any of the above implementations in modified embodiments. A leadframe having a plurality of leads is provided at step 830. For example, leads 930 having bonding surfaces 931 and non-bonding surfaces 932 may be provided. Portions of the leadframe and the leads 930 may be encapsulated at step 835 in molding resin 955 or in ceramic material that also may form a chip support cavity having an inner surface 915. Normally, portions of the bonding surfaces 931 of the leads 930 remain exposed following the encapsulation. An image sensor chip 905 is provided at step 840, the chip having an active surface 910 and a corresponding back surface 912 that is attached to the inner surface 915 of the chip support cavity. In a modified embodiment, the molding resin 955 beneath the image sensor chip 905 may be omitted (e.g., before insertion of the image sensor chip 905) to expose part or all of the back surface 912 of the image sensor chip 905. The active surface 910 may have a light receiving area and a peripheral area including a plurality of bonding pads 925. Wires are connected between the plurality of bonding pads 925 and the bonding surfaces 931 of the leads 930 at step 845. A transparent lid 950, which may have at least one of a concave, convex, or flat shape, is formed at step 850, the transparent lid 950 being disposed to direct light to the light receiving area of the active surface 910 of the image sensor chip 905.

In view of the foregoing, it will be understood by those skilled in the art that the methods of the present invention can facilitate fabrication of image sensor packages. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. An image sensor package, comprising:
    an image sensor chip having an active surface, and a corresponding back surface, wherein the active surface comprises a light receiving area and a peripheral area having a plurality of bonding pads;
    a leadframe comprising a plurality of leads, the leads being disposed at a periphery of the image sensor chip, the leadframe further comprising at least one elongated chip supporting bar attached to the peripheral area and not interfering with the plurality of bonding pads;
    a plurality of wires electrically connecting the plurality of bonding pads to the plurality of leads,
    an encapsulation covering at least a portion of the image sensor chip, the plurality of leads, and a portion of the at least one elongated chip supporting bar, the encapsulation forming a cavity over the active surface and exposing the light receiving area; and
    a transparent lid disposed over the cavity and disposed to direct light to the light receiving area.

2. The image sensor as set forth in claim 1, wherein the at least one elongated chip supporting bar comprises a plurality of elongated chip supporting bars.

3. The image sensor package as set forth in claim 1, wherein the back surface is exposed to enhance thermal dispersion.

4. The image sensor package as set forth in claim 2, wherein the supporting bars are attached to the peripheral area by one of a liquid and a solid non-conductive adhesive.

5. The image sensor package as set forth in claim 1, wherein the transparent lid comprises one or more of a flat shape, a convex shape, and a concave shape.

6. The image sensor package as set forth in claim 1, wherein the encapsulation comprises ceramic material.

7. The image sensor package as set forth in claim 1, wherein the encapsulation comprises plastic resin.

8. The image sensor as set forth in claim 1, wherein:
    the plurality of leads comprises bonding surfaces and non-bonding surfaces;
    the plurality of wires electrically connects the plurality of bonding pads to the bonding surfaces of the plurality of leads; and
    non-bonding surfaces of the plurality of leads are not covered by the encapsulation.

9. The image sensor package as set forth in claim 8, wherein the back surface is exposed to enhance thermal dispersion.

10. The image sensor package as set forth in claim 8, wherein:
    the at least one elongated chip supporting bar comprises a plurality of elongated chip supporting bars; and
    the supporting bars are attached to the peripheral area by one of a liquid and a solid non-conductive adhesive.

11. The image sensor package as set forth in claim 8, wherein the transparent lid comprises one or more of a flat shape, a convex shape, and a concave shape.

12. The image sensor package as set forth in claim 8, wherein the encapsulation comprises ceramic material.

13. The image sensor package as set forth in claim 8, wherein the encapsulation comprises plastic resin.

* * * * *